United States Patent
Bruennert et al.

(10) Patent No.: US 8,015,438 B2
(45) Date of Patent: Sep. 6, 2011

(54) MEMORY CIRCUIT

(75) Inventors: Michael Bruennert, Munich (DE); Christoph Bilger, Munich (DE); Peter Gregorius, Munich (DE); Maurizio Skerlj, Munich (DE); Wolfgang Walthes, Munich (DE); Johannes Stecker, Munich (DE); Hermann Ruckerbauer, Moos (DE); Dirk Scheideler, Munich (DE); Roland Barth, Munich (DE)

(73) Assignee: Qimonda AG, München (DE)

( * ) Notice: Subject to any disclaimer, the term of this patent is extended or adjusted under 35 U.S.C. 154(b) by 772 days.

(21) Appl. No.: 11/947,320

(22) Filed: Nov. 29, 2007

(65) Prior Publication Data

US 2009/0144583 A1    Jun. 4, 2009

(51) Int. Cl.
*G06F 11/00* (2006.01)
(52) U.S. Cl. .......... 714/6.13; 714/6.1; 714/6.32; 714/42
(58) Field of Classification Search .................. 714/5, 6, 714/7, 8, 30, 36, 42, 52, 54, 5.1, 6.1, 6.11, 714/6.13, 6.32
See application file for complete search history.

(56) References Cited

U.S. PATENT DOCUMENTS

| | | | | |
|---|---|---|---|---|
| 3,755,791 A | * | 8/1973 | Arzubi | 714/5 |
| 4,479,214 A | * | 10/1984 | Ryan | 714/42 |
| 5,805,789 A | * | 9/1998 | Huott et al. | 714/7 |
| 6,240,525 B1 | * | 5/2001 | Chiang | 714/8 |
| 6,601,194 B1 | * | 7/2003 | Dahn et al. | 714/42 |
| 2002/0046358 A1 | * | 4/2002 | Terzioglu | 714/6 |
| 2002/0184557 A1 | * | 12/2002 | Hughes et al. | 714/8 |
| 2005/0015654 A1 | * | 1/2005 | Marr | 714/6 |
| 2005/0039073 A1 | * | 2/2005 | Hartmann | 714/6 |
| 2007/0121370 A1 | * | 5/2007 | Ellis et al. | 365/154 |

* cited by examiner

*Primary Examiner* — Robert Beausoliel, Jr.
*Assistant Examiner* — Joseph D Manoskey
(74) *Attorney, Agent, or Firm* — Coats & Bennett, P.L.L.C.

(57) ABSTRACT

The invention provides a memory circuit comprising a plurality of storage cells for storing data and redundant spare storage cells for replacing defective storage cells, and a memory access logic for accessing said storage cells connected to a replacement setting register which is writeable during operation of said memory circuit to store replacement settings.

21 Claims, 8 Drawing Sheets

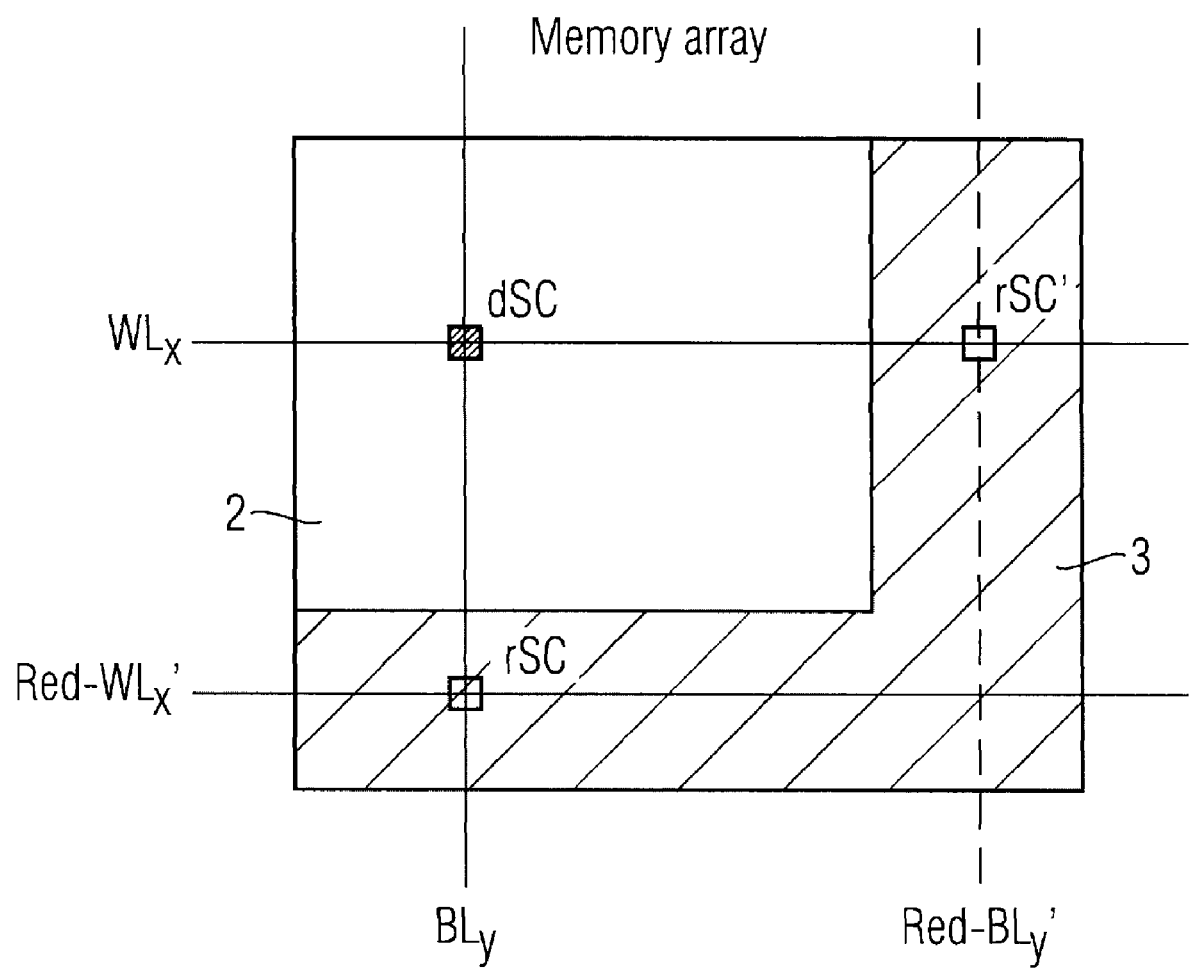

FIG 4A

Replacement setting (RS):

| Location of defect storage cell (cluster) | Location of spare storage cell (cluster) |
|---|---|

FIG 4B

Replacement setting
<u>Register:</u>

| RS1 |
|---|
| RS2 |
| ⋮ |
| $RS_k$ |

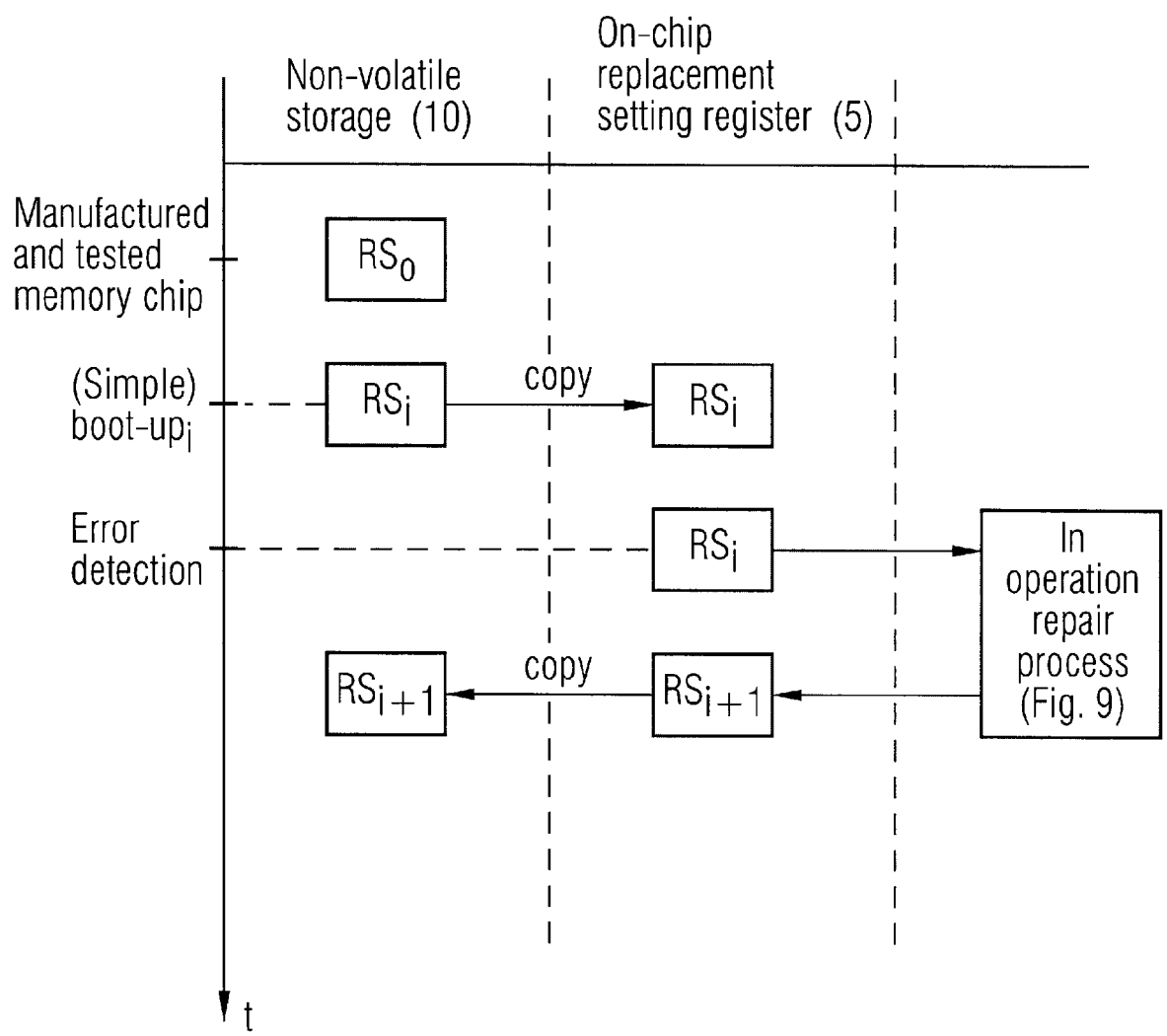

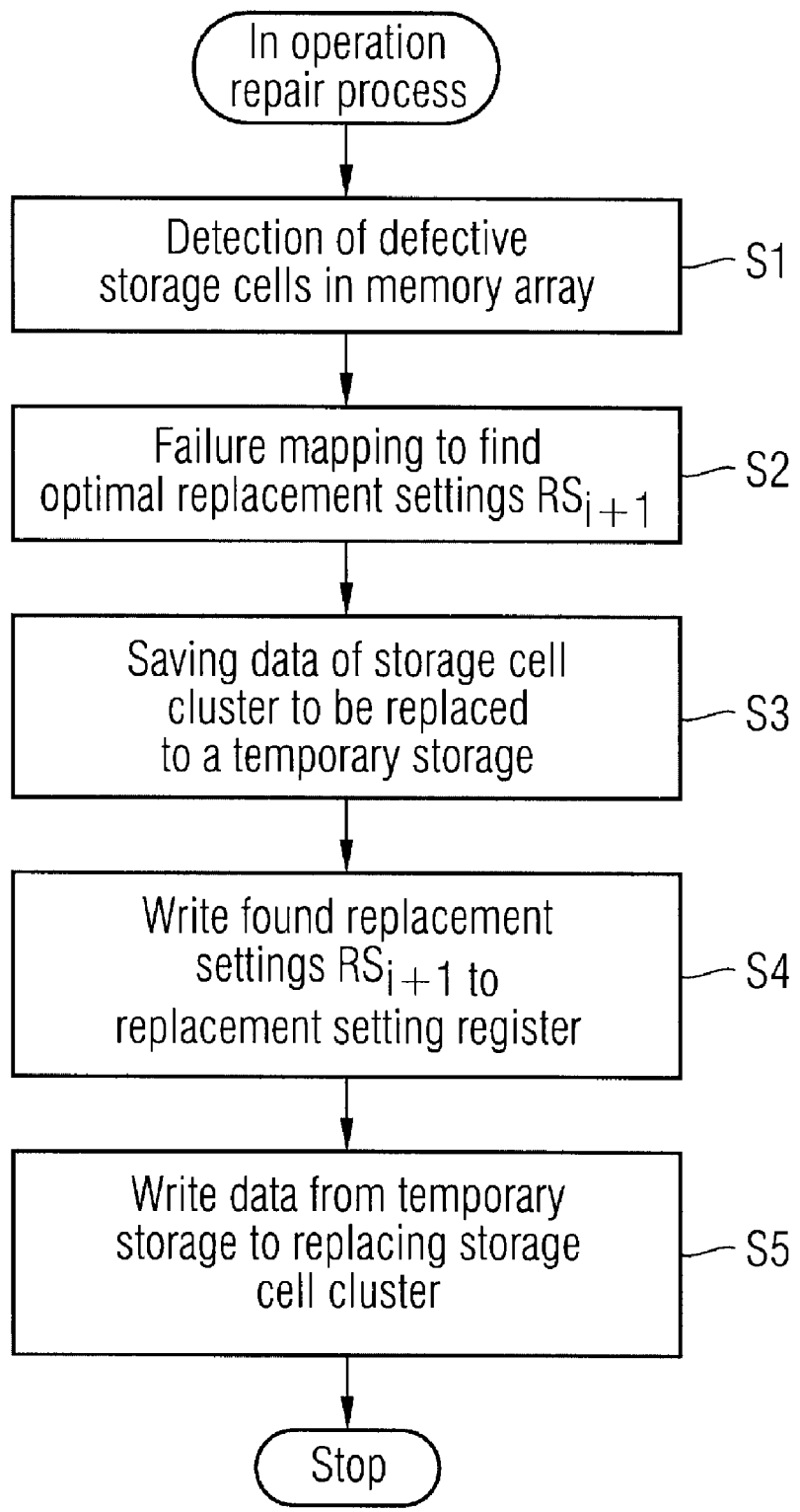

MEMORY CIRCUIT

The invention relates to a memory circuit comprising a memory array with a plurality of storage cells for storing data.

TECHNICAL BACKGROUND OF THE INVENTION

Storage cells of a memory circuit can become defective during and after manufacturing of the memory circuit. Accordingly, conventional memory circuits comprise redundant storage cells to replace defective storage cells. These redundant storage cells are used for fixing defective storage cells directly after manufacturing the memory circuit. In known systems comprising memory circuits coding/error correction is performed to cope with errors occurring later during system operation. The coding/error correction uses redundancy added to the data. Conventional memory circuits are prone to failure when further errors occur and must be exchanged quickly to minimize the probability of a second—then unrecoverable—failure.

More advanced conventional memory circuits provide redundant spare storage cells and use electrical fuse technology to exchange failed storage cells detected by an error detection and correction unit with spare storage cells. These programmable electrical fuses need a lot of silicon area when integrating the memory circuit on a chip. Moreover, it takes a long time to program these fuses during which the memory circuit is not available for operation.

Usually electric fuse self repair uses another small set of redundant storage cells next to the normal redundant storages cells used for repair after manufacturing the memory circuit. This is mainly due to the big size of the electrical fuses with does not allow to place them close to the normal redundancy circuit. Therefore, electric fuse self repair is usually capable of repairing a few bits, but not a complete wordline or bitline. Consequently electric fuse self repair can be used for repair after manufacturing a memory circuit because when soldering an error free memory circuit such as a DRAM on a memory module such as a DIMM the heating of said memory circuit may typically turn few storage cells which had been working before into faulty storage cells repairable by electric fuse repair. However, for long time reliability of the memory circuit, when more errors may pop up during operation of said memory circuit electric fuse repair is not sufficient.

Accordingly, it is an object of the present invention to provide a memory circuit and a method which provides fast repair of a memory circuit when a defective storage cell is detected during operation of the memory circuit.

SUMMARY OF THE INVENTION

The invention provides a memory circuit comprising
(a) a plurality of storage cells for storing data and redundant spare storage cells for replacing defective storage cells; and
(b) a memory access logic for accessing said storage cells connected to a replacement setting register which is writeable during operation of said memory circuit to store replacement settings.

In an embodiment of the memory circuit replacement settings stored in the replacement setting register indicate which storage cells are replaced by spare storage cells.

In an embodiment of the memory circuit each replacement setting stored in the replacement setting register comprises information data about the location of a storage cell cluster having at least one defective storage cell; and information data about a location of a spare storage cell cluster replacing the defective storage cell cluster.

In an embodiment of the memory circuit the storage cell cluster is formed by a row of storage cells within a memory array of said memory circuit which are addressable by the same wordline.

In an embodiment of the memory circuit the storage cell cluster is formed by a column of storage cells within a memory array of said memory circuit which are addressable by the same bit line.

In an embodiment of the memory circuit the replacement setting register consists of flip-flop-circuits for storing the replacement settings.

In an embodiment of the memory circuit the replacement setting register is writable to store the replacement settings using a supply voltage of a normal operation mode of the memory circuit.

In an embodiment of the memory circuit the replacement setting register is rewritable within a short time period of less than 10 nsec.

In an embodiment of the memory circuit the memory circuit comprises at least one input/output circuit for connecting the memory circuit to a memory controller.

In an embodiment of the memory circuit said memory controller is connected to a processor.

In an embodiment of the memory circuit a non-volatile storage is connected to the memory controller or to the processor.

In an embodiment of the memory circuit an error detection and correction unit is provided to determine defective storage cells of said memory circuit.

In an embodiment of the memory circuit if said error detection and correction unit determines defective storage cells during an operation of the memory circuit data stored in the defective storage cells is saved to a temporary data storage.

In an embodiment of the memory circuit the error detection and correction unit is provided in said memory controller.

In an embodiment of the memory circuit the error detection and correction unit is provided between the memory access logic and an input/output circuit for connecting the memory circuit to a memory controller.

In a further embodiment the memory circuit comprises:
(a) a plurality of storage cells for storing data and redundant spare storage cells for replacing defective storage cells; and
(b) a writeable replacement setting register for storing replacement settings indicating which storage cells are replaced by redundant spare storage cells.

The invention further provides a method for in-operation memory repair of a memory circuit comprising the steps of:
(a) performing a failure mapping to determine updated replacement settings depending on the location of defective storage cells detected during operation of said memory circuit and depending on replacement settings already stored in a replacement setting register of said memory circuit;
(b) saving data stored in the storage cells to be replaced according to the updated replacement settings by redundant spare storage cells into a temporary data storage;
(c) writing the updated replacement settings in said replacement setting register; and
(d) writing the saved data from the temporary data storage to the redundant spare storage cells indicated by the updated replacement settings.

In an embodiment of the method the replacement settings are loaded in the replacement setting register from a non-volatile storage during a boot-up of said memory circuit.

The invention further provides a method for performing a memory repair of a memory circuit during a boot-up of the memory circuit comprising the steps of:
(a) performing a boot-up memory test and deriving a failure mapping on the basis of failure information provided by said boot-up memory test to determine updated replacement settings depending on the location of defective storage cells detected during a boot-up of said memory circuit and depending on previous replacement settings loaded from a non-volatile storage;
(b) writing the updated replacement settings to a replacement setting register of said memory circuit.

In an embodiment of the method the updated replacement settings are copied from the replacement setting register to the non-volatile storage.

BRIEF DESCRIPTION OF THE FIGURES

FIG. 3 shows a diagram illustrating an example of mapping as employed by the memory circuit and by the method according to an embodiment of the present invention;

FIG. 4A shows the data structure of a replacement setting as employed by an embodiment of the apparatus and the method according to the present invention;

FIG. 4B shows a data content of a replacement setting register as employed by an embodiment of the method and apparatus according to the present invention;

FIG. 5 shows a diagram for illustrating a functionality of the apparatus and method according to an embodiment of the present invention;

FIG. 9 shows a further flow-chart of an in-operation repair process as employed by an apparatus and a method according to a possible embodiment of the present invention.

DETAILED DESCRIPTION OF THE EMBODIMENTS

Figure 1:
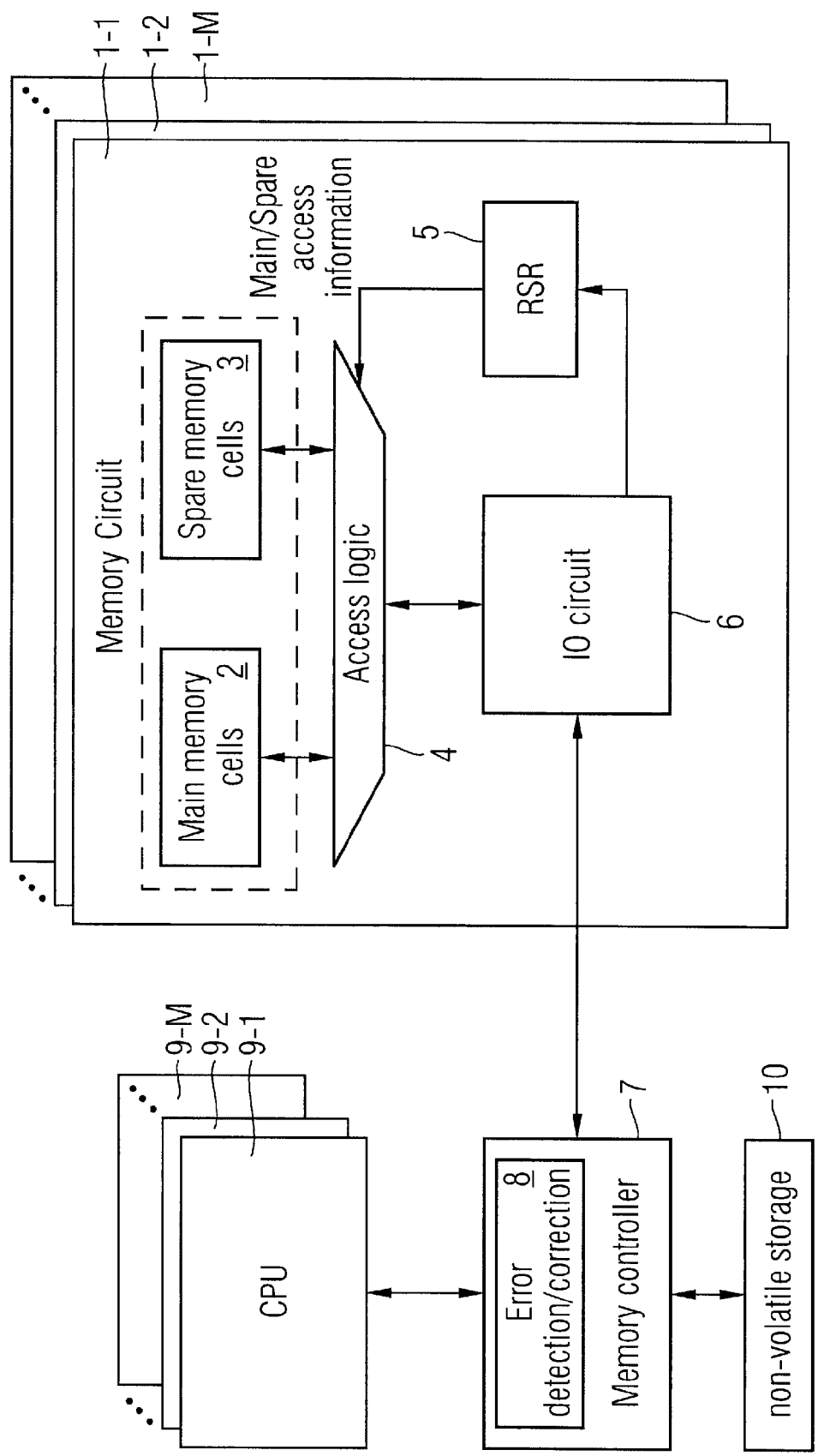
FIG. 1 shows an embodiment of a memory circuit according to the present invention.

As can be seen from FIG. 1, a memory circuit 1 according to an embodiment of the present invention comprises a plurality of storage cells 2 for storing data forming a main memory. Further, the memory circuit 1 comprises redundant spare storage cells 3 for replacing defective storage cells. The storage cells 2 and the spare storage cells 3 can form part of the same memory array as shown in FIG. 3.

The memory circuit 1 further comprises a memory access logic 4 for accessing the storage cells 2 and the spare storage cells 3. The memory access logic 4 is connected in a possible embodiment directly to a replacement setting register 5. The replacement setting register 5 is writable during operation of the memory circuit 1 to store replacement settings RS. The stored replacement settings RS indicate which defective storage cells 2 are replaced by spare storage cells 3. In the embodiment shown in FIG. 1 both the memory access logic 4 and the replacement setting register 5 are connected to an input/output circuit 6 of said memory circuit 1 provided for connecting the memory circuit 1 to a memory controller 7.

In the embodiment shown in FIG. 1 the memory controller 7 comprises an error detection and correction unit 8. The memory controller 7 is connected to at least one central processing unit or processor 9. Further, the memory controller 7 is connected to a non-volatile storage 10. The error detection and correction unit 8 provided in said memory controller 7 can access defective storage cells of the main memory 2 in the memory circuit 1 or spare storage cells 3 already replacing storage cells of the main memory 2. The memory controller can access a combination of the main and spare memory cell array as seen through the access logic 4 with the corresponding replacement settings.

As can be seen from FIG. 1, the memory system comprises several memory circuits 1-$i$ which are connected to the same memory controller 7. In the given example of FIG. 1, there are N memory circuits 1-$i$ connected to the memory controller 7. Furthermore, the memory controller 7 can be connected to several processors 9-$i$. In the exemplary system shown in FIG. 1, the memory controller 7 is connected to M processors 9. The error detection and correction unit 8 within the memory controller 7 is provided to discover defective memory cells or storage cells within the memory circuit 1. Connected to the memory controller 7 or to the processor 9, a non-volatile storage medium 10 is provided to safe information data permanently. The non-volatile storage medium can be formed by a DIMM SPD (Serial Presence Detect) a Bios CMOS RAM, a Flash memory or a hard disk.

The replacement setting register 5 as shown in FIG. 1 is formed in a possible embodiment by flip-flops for the storing of replacement settings RS. As shown in FIG. 4A, each replacement setting RS indicates a location of a defective storage cell or a location of a defective storage cell cluster. For each stored location of a defective storage cell or defective storage cell cluster a corresponding location of spare storage cells or a location of a spare storage cell cluster is stored in the replacement setting register 5 as shown in FIGS. 4A, 4B.

The replacement setting register 5 can comprise information data about a location of a storage cell cluster having at least one defective storage cell and information data about a location of a spare storage cell cluster replacing the defective storage cell cluster. The storage cell cluster can for example be formed by a row of storage cells within a memory array which are addressable by the same word line WL. The storage cell cluster can also be formed by a column of storage cells within a memory array which are addressable by the same bit line BL.

The replacement setting register 5 is formed in a possible embodiment by a volatile register consisting of flip-flop circuits storing the replacement settings RS. In further embodiments the replacement setting register 5 can be formed by a SRAM memory, a latch or other type of volatile storage means. The replacement setting register 5 is writable during operation of the memory circuit 1 to store the replacement settings RS using a normal operation supply voltage of said memory circuit 1, e.g. V supply <1.5V. The replacement setting register 5 is writable within a short time period of less than e.g. 10 nsec. In a possible embodiment the memory circuit 1 is formed by a DRAM circuit wherein the short writing time period of the replacement setting register 5 allows keeping the normal refresh cycles of the DRAM memory circuit 1, i.e. changing the replacement settings is performed so fast that a refresh cycle is not delayed.

In the given example in FIG. 4B K replacement settings RS are stored in the replacement setting register 5. In a possible implementation, there can be multiple of the replacement registers, each coping with a different kind of clusters. I.e. in a typical memory circuit, one has fuses storing information about row redundancy, fuses for column redundancy and eFuses for single bit redundancy.

During normal operation of the memory circuit 1, the error detection and correction unit 8 provided within the memory controller 7 of the exemplary embodiment of FIG. 1 can access defective storage cells in the main memory 2 or spare storage cells already replacing storage cells of the main memory as shown in FIG. 1. If a defective storage cell cluster is detected by the error detection and correction unit 8 data of the storage cell cluster to be replaced is saved to a temporary data storage such as a register to avoid loss of data.

In the example shown in the diagram of FIG. 3, a memory array of the memory circuit 1 comprises normal storage cells 2 for storing data and spare storage cells 3 wherein each storage cell is addressable by a word line WL and a bit line BL. In the shown example the error detection and correction unit 8 of the memory controller 7 detects a defective storage cell as a crossing of the word line $WL_X$ and the bit line $BL_Y$. If such a defective storage cell dSC is detected a mapping unit performs a failure mapping algorithm to find an optimal replacement setting RS depending on the location of the found defective storage cell dSC, i.e. depending on the occurred error and depending on a repair history of already performed repairs indicated by the replacement settings RS stored in the replacement setting register 5 of the memory circuit 1.

In the example shown in FIG. 3 the defective storage cell dSC is replaced by the redundant spare storage cell rSC. This is done by mapping word line $WL_X$ to the redundant word line RED-$WL_X$ in FIG. 3. An alternative solution for repairing the defect storage cell dSC would be to map bit line $BL_Y$ of the defective storage cell dSC the redundant bit line RED-$BL_Y$' and to keep the word line $WL_X$ thus replacing the defective storage cell dSC by the redundant storage cell rSC'.

If, for example after the defective storage cell dSC is replaced by the redundant storage cell rSC as shown in FIG. 3, i.e. by mapping word line $WL_X$ to redundant word line $WL_X$', and a further defective storage cell is detected in the same bit line $BL_Y$ it would be possible to repair two defective storage cells dSC addressable by the same bit line $BL_Y$ by replacing the bit line $BL_Y$ by a redundant bit line $BL_Y$'. In this situation, the mapping unit can reverse the replacement of word line $WL_X$ by redundant word line $WL_X$' and can replace bit line $BL_Y$ by redundant bit line $BL_Y$' to repair both defective storage cells dSC in the main memory 2. In this case, only one bit line BL of the redundant memory 3 will be used up to repair two defective storage cells dSC. An alternative repair setting RS might be to map the word line WL of the second defective storage cell dSC in the main memory 2 to a further redundant word line RED-WL in the spare memory 3, however, in this case two word lines WL of the redundant memory 3 are occupied for repairing two defective storage cells dSC in the main memory 2. Accordingly, the mapping unit optimizes the replacement setting RS by repairing both defective storage cells dSC by replacing $BL_Y$ by the redundant bit line RED-BLY' as shown in FIG. 3, thus occupying only one bit line of the spare memory 3 to repair two defective storage cells at the same time. In a possible embodiment of the memory circuit 1 according to the present invention, the mapping unit performs a failure mapping algorithm to find an optimal replacement setting RS. With the replacement setting register 5 of the memory circuit 1 which is a writable register containing writable flip-flops it is possible to reverse already performed replacement settings RS to implement an optimal replacement setting to repair defective storage cells in the main memory 2. This can become necessary, as soon as a further error occurs because then a different mapping may provide better results than the existing mapping.

As indicated in FIG. 1, the mapping unit for performing the failure mapping can be provided in a possible embodiment between the memory access logic 4 and the replacement setting register 5. In a further embodiment the mapping unit can be provided between the replacement setting register 5 and the input/output circuit 6. The mapping unit converts information data about the location of failing storage cells into an optimum use of spare storage cells. In further possible embodiments the mapping unit can be provided within the memory controller 7 or within the processor 9. There are multiple possibilities for implementing the mapping circuit. The mapping circuit can be implemented as a hardware circuit and placed between the replacement setting register 5 and the memory access logic 4, between the input/output circuit 6 and the replacement setting register 5 as well as in the memory controller 7. The mapping unit can be implemented as software in the firmware or in the operating system running on one of the processing units of the system. In contrast to conventional memory circuits using for example fuses for replacing storage cells by redundant cells, the rewritable replacement setting register 5 allows to reverse replacement settings RS and to optimize the use of the provided spare storage cells 3.

FIG. 5 shows a diagram illustrating the functionality of a memory circuit 1 according to a possible embodiment of the present invention. After manufacturing of the memory circuit 1 the manufacturer can run a production test as shown in the flow-chart of FIG. 6 to determine an initial replaced setting $RS_0$ and store the found replacement setting $RS_0$ in the non-volatile storage 10 as shown in FIG. 1.

Figure 7:
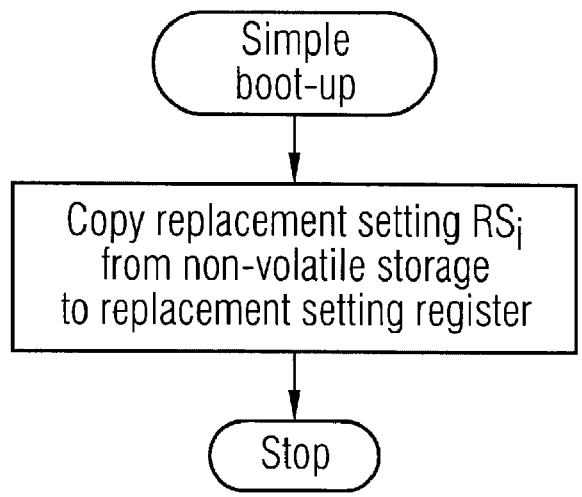
FIG. 7 shows a flow-chart of a simple boot-up process which is employed by an apparatus and a method according to a possible embodiment of the present invention.

After activating the memory circuit 1 a simple boot-up procedure can be performed as shown in FIG. 7. In a simple boot-up procedure the actual replacement setting stored in the non-volatile storage 10 is copied to the replacement setting register 5 of the memory circuit 1 as indicated in FIG. 5.

If during normal operation of the memory circuit 1 the error detection correction unit 8 detects an error, i.e. one failed or defective storage cell of the main memory 2 the replacement setting stored in the on-chip replacement setting register 5 can be used by an in-operation repair process as illustrated in FIGS. 5 and 9.

FIG. 9 shows a flow-chart of a possible embodiment of an in-operation repair process as employed by the memory circuit 1 according to an embodiment of the present invention. If the error detection and correction unit 8 detects in step S1 an error, i.e. defective storage cells or a defective storage cell cluster in the main memory 2, the mapping unit performs in step S2 the failure mapping algorithm to find an optimal replacement setting RS. The optimal replacement setting RS is determined by the mapping unit depending on the actual found defective storage cells detected by the error detection and correction unit 8 and also depending on a repair history stored in the replacement setting register 5 in form of already existing replacement setting entries. Updated replacement settings $RS_{i+1}$ are calculated by the mapping unit depending on the location of the defective storage cells detected during the operation of the memory circuit 1 and depending on the replacement settings $RS_i$ already stored in the replacement setting register 5 of the memory circuit 1. In a further step S3, data of a storage cell cluster or multiple cell clusters to be replaced according to the updated replacement settings RS by redundant spare storage cells are saved to a temporary data storage which is provided for example in the error detection and correction unit 8. In a further step S4, the updated replacement settings $RS_{i+1}$ are written into the replacement setting register 5. Finally, the saved data from the temporary data storage is written in step S5 to the redundant spare storage cells indicated by the updated replacement settings $RS_{i+1}$ stored in the replacement setting register 5 of the memory circuit 1.

The replacement settings RS stored in the replacement setting register 5 is then copied for further use to the non-volatile storage 10 as indicated in FIG. 5.

Figure 6:
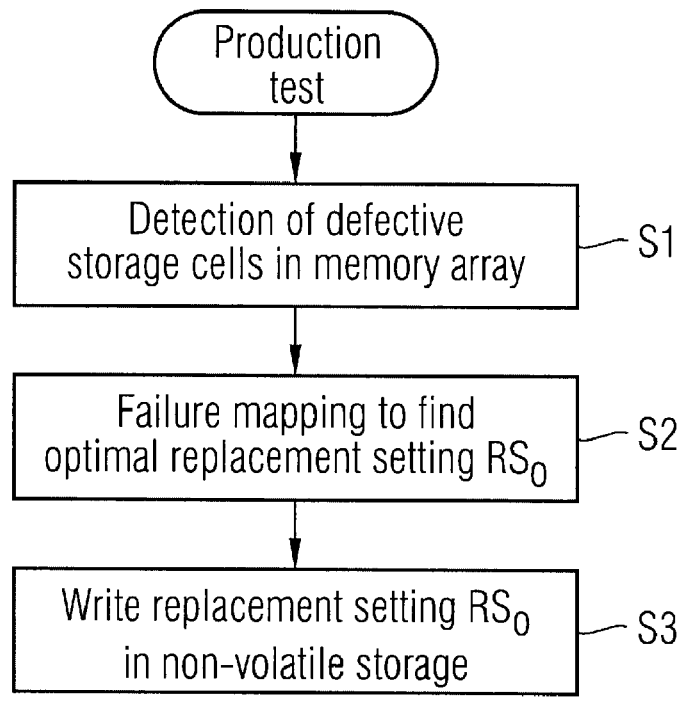
FIG. 6 shows a flow-chart of a production test after manufacturing a memory circuit according to an embodiment of the present invention.

FIG. 6 shows a flow-chart of a possible embodiment of a production test for testing a memory circuit 1 according to an embodiment of the present invention. A production test can be run on one or several of the memory circuits 1 according to an embodiment of the present invention to detect in step S1 defective storage cells in the memory array by a production tester. The production tester writes predetermined patterns of data into the memory array, reads it back and compares it to the known expected data values. A mapping unit step S2 a failure mapping to calculate an initial optimal replacement settings $RS_0$ replacing the defective storage cells. In a further step S3 the found optimal replacement settings $RS_0$ are stored in the non-volatile storage 10 and can be used by the memory circuit 1 after its respective boot-up. The non-volatile storage is for instance a DIMM SPD which is delivered from the memory manufacture to the computer system manufacturer together with the memory component. When the non-volatile storage is located in the computer system, a data record, is provided i.e. an electronic database stating the RS records for all parts, which can be identified by their serial number. In a simple boot-up procedure a replacement setting RS stored in the non-volatile storage 10 can be loaded during boot-up of the memory circuit 1 to its replacement setting register 5 as shown in the flow-chart of FIG. 7.

Figure 8:
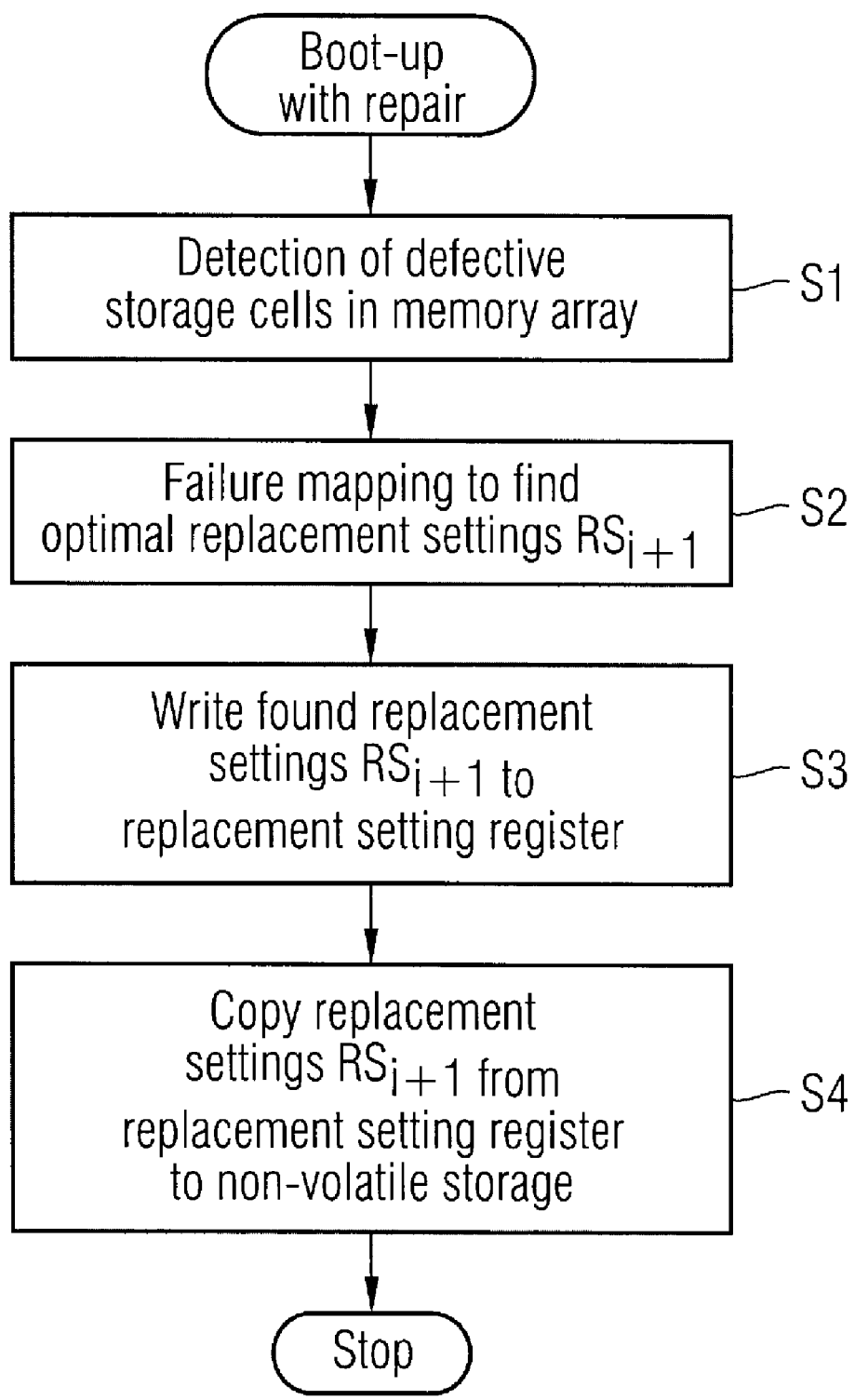
FIG. 8 shows a further flow-chart of a boot-up procedure with a repair mechanism as employed by an apparatus and a method according to a possible embodiment of the present invention.

In a more complex boot-up procedure the memory repair can be performed as shown in the flow-chart of FIG. 8. After initiating a boot-up the computer system detects automatically defective storage cells in the main memory 2 of the memory circuit 1 by running a memory test in step S1. This maybe even done without an error detection and correction unit, since in a test, one knows, what has been written before. Therefore it is possible to check, if a read was error free. During normal operation, one doesn't know, what had been written before, thus coding with redundancy needs to be in to check, if the data is correct. Thus, the procedure shown in FIG. 9 relies on coding and error correction, whereas the procedure shown in FIG. 8 may be implemented in systems without such possibilities. Since error detection/correction is usually available in servers only and not in normal PCs, the procedure of FIG. 8 is an interesting option for normal PCs. In a further step S2 of the boot-up procedure the mapping unit performs an automatic failure mapping to calculate updated replacement settings RS depending on the location of the detected defective storage cells and depending on replacement settings $RS_i$ loaded from the non-volatile storage 10. In a further step S3 the found updated replacement settings $RS_{i+1}$ are written to the replacement setting register 5 of the respective memory circuit 1. Finally, the updated replacement settings $RS_{i+1}$ are copied from the replacement setting register 5 back to the non-volatile storage 10 for further use.

Figure 2:
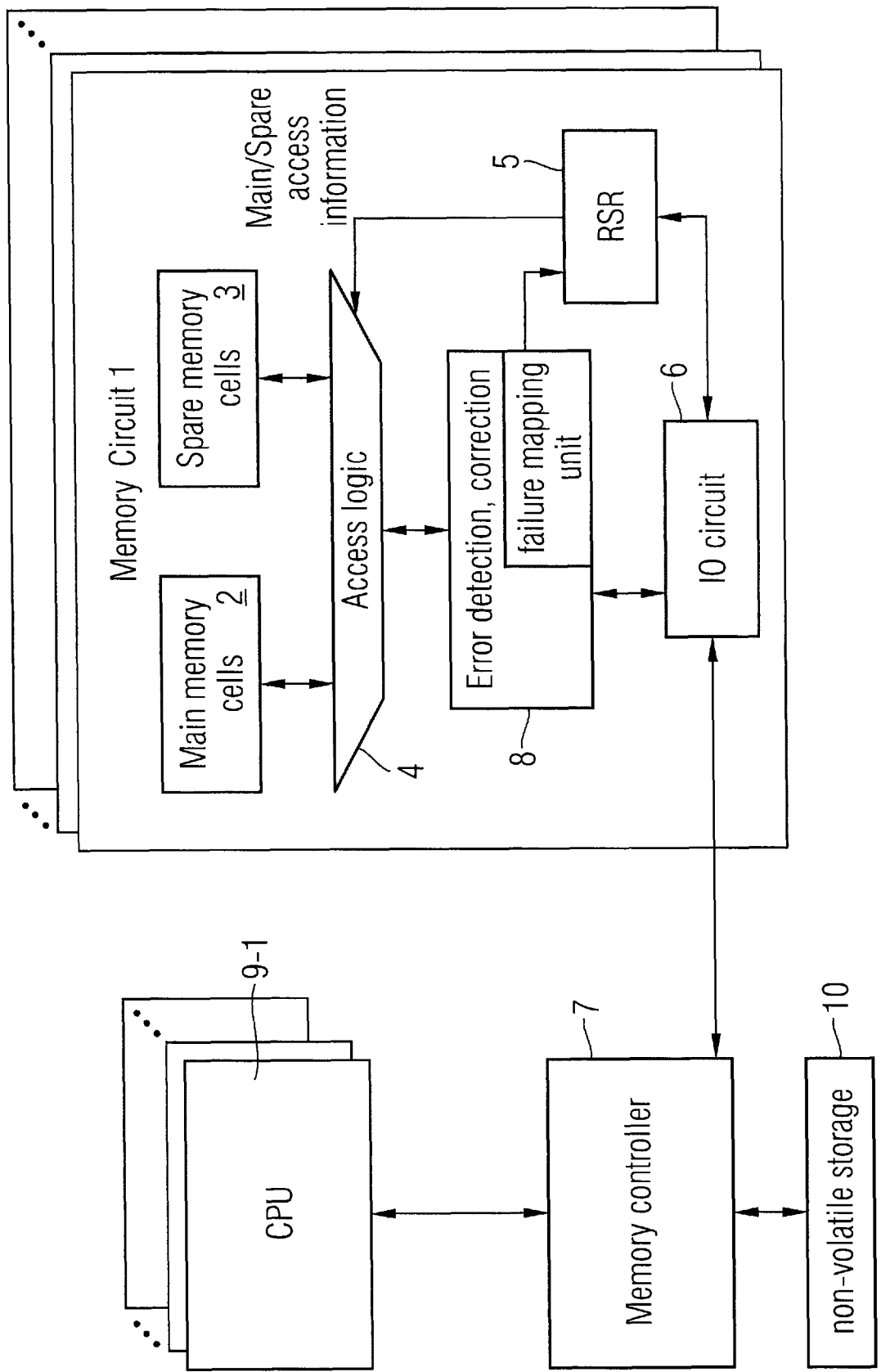
FIG. 2 shows a further embodiment of a memory circuit according to the present invention.

FIG. 2 shows a further embodiment of the memory circuit 1 according to the present invention. In this embodiment the error detection and correction unit 8 is provided within the memory circuit 1. In the given embodiment of FIG. 2 data is not exchanged between the memory access logic 4 and the input/output circuit 6 directly. The error detection and correction unit 8 adds necessary redundancy during write operations. During read operations the error detection and correction unit 8 calculates whether errors have occurred and corrects them if necessary, returning the correct data to the input/output circuit 6. Furthermore, the error detection and correction unit 8 performs an algorithm to derive information data about the defective storage cells from the detected errors. This can include filtering out random storage errors such as alpha-particle induced errors. In a possible embodiment, the error detection and correction unit 8 finds out the error topology of the occurred error. In this case, the error detection and correction unit 8 decides, whether a single defective storage cell or a cluster fails, i.e. a complete row of storage cells or a complete column of storage cells is affected by the error. Then, the failure mapping unit connected to the error detection unit 8 calculates an optimum replacement strategy for minimum spare cell usage. In a possible embodiment the mapping unit has a direct access to the replacement storage register 5 controlling the memory access logic 4. Further, the mapping unit can directly control replacements of defective storage cells by spare storage cells.

There are two phases of system operation when operating a system as shown in FIGS. 1 and 2. The first phase is a boot-up and the second phase is a normal operation phase of the memory circuit 1.

During the boot-up of the memory circuit 1 as shown in FIG. 1 before starting normal system operation, the memory controller 7 for the processor 9 performs several tasks. First, the memory storage cell failure data is read from the non-volatile storage 10. Then, this data is written into the replacement setting register 5 of the appropriate memory circuit 1. Depending on the position of the mapping circuit 1, a mapping algorithm is executed on the basis of the data stored in the permanent non-volatile storage 10 before writing it to the replacement setting register 5 of the memory circuit 1.

After this operation, the memory system as shown in FIG. 1 is in the same state as before the last previous shutdown. All failing memory storage cells detected so far are replaced by spare storage cells resulting in a reliable, error free memory sub-system allowing the system to enter a normal operation mode.

During normal operation, further failures can occur, for example due to wearout or stress. The memory controller 7 detects and corrects these failures by means of an appropriate technique, such as ECC. Then, the memory controller 7 can execute further tests like re-writing the memory cell to determine if the error was due to a temporary loss of data, such as an alpha-particle induced soft error, a transmission error or due to a defective storage cell in the memory circuit 1. If it is determined that the failure has occurred because of at least one defective memory storage cell, the following actions are performed. Data stored at the defective storage cell location obtained from the error correction unit 8 is copied to a temporary data storage. Then, the location of the defective storage cells or the defective storage cell cluster is written into the replacement setting register 5 of the memory circuit 1 and the defective storage cells are replaced by spare storage cells 3. In a further step, the saved temporary data is re-written to the spare storage cells 3 replacing the defective storage cells. Then, the memory circuit 1 is consistent with the state before the defect has occurred. Data indicating the location of the defective storage cells 2 is written into the non-volatile storage 10. This process is not time critical and can be postponed to an appropriate point of time. If the mapping procedure is implemented in software, the mapping is applied before writing information data to the replacement setting register file 5 of the memory circuit 1.

In a possible embodiment, the system as shown in FIG. 1 keeps track of remaining spare storage cells 3 and gives a warning to a system operator if the memory device 1 runs out of spare storage cells.

In the second embodiment as shown in FIG. 2 similar to the first embodiment, the memory circuit 1 comprises a set of normal and a set of spare storage cells driven by memory access logic 4 controlled by a replacement setting register 5 with IO-connection. During boot-up, behavior of both embodiments as shown in FIGS. 1 and 2 is equal and the memory controller 7 or the CPU 9 copies defective cell information from the non-volatile storage 10 to the replacement setting register 5 provided within the memory circuit 1.

During normal system operation, the behavior of the two embodiments as shown in FIGS. 1 and 2 is different. In the embodiment as shown in FIG. 2, the memory circuit 1 detects defective storage cells itself by analysis of an error detected by an internal error detection and correction unit 8 as shown in FIG. 2. Upon detection of a defective storage cell, the following actions are performed. A mapping unit calculates an optimum spare storage cell mapping. The data content of the defective storage cells recovered by the error correction unit is saved to a temporary data storage. Then, the spare cell mapping, i.e. the replacement setting RS is written into the replacement register file 5 of the memory circuit 1. The data content of the defective storage cells is restored into the mapped spare memory cells. The memory circuit 1 further signals the mapping process to the memory controller 7 over the input/output circuit 6. For example, the memory circuit 1 informs the memory controller 7 that a mapping has occurred. In a further embodiment, the memory circuit 1 can give detailed information about the performed mapping and statistics, for example how much spare capacity is left to the memory controller 7. When the memory controller 7 receives a signal from the memory circuit 1 that a defective cell replacement has occurred, it copies information data about the mapping into the non-volatile storage 10. If the memory circuit 1 only signals that a mapping has occurred, the memory controller 7 reads out the replacement setting register 5 of the memory circuit 1 and copies the data to the permanent non-volatile storage 10. If further information about details of the mapping is available, it can be used to update the information data stored in the non-volatile storage 10 without read-out of the complete replacement setting register file 5 thus saving time. Then, the memory controller 7 signals an occurrence of a defective cell replacement, including free space capacity of the memory circuit (if available) to a system operator.

The memory circuit 1 as shown in FIGS. 1 and 2 can be formed by any kind of memory component, such as a memory chip or a memory module, for example a dual-inline memory module.

In the system according to the present invention, the task of permanently storing information and defective storage cells can be moved from the memory circuit 1 to the computer system. The memory circuit 1 stores information about defective storage cells in a writeable register 5. This writeable register 5 allows fast writing and quick replacement of defective storage cells with very little memory system interruption. Furthermore, the system ensures that the permanent data stored in the non-volatile storage 10 and the volatile data stored in the replacement setting register 5 within the memory circuit 1 are consistent with each other.

With the memory circuit 1, storing information can be done without interfering with normal operations. The storage space as provided by the replacement setting register 5 is cheaper in terms of chip area in comparison to conventional systems using fuses. Furthermore, the storage area can be more flexible managed. The writeable replacement setting register allows a faster replacement of defective storage cells. Furthermore, storing of the replacement settings RS within the replacement setting register 5 is possible by using only the low supply voltage applied to the memory circuit 1 during normal operation of the memory circuit. Furthermore, with the rewriteable replacement setting register file 5 it is possible to reverse already found replacement strategies when further errors occur during operation of the memory circuit 1.

The invention claimed is:

1. A memory circuit, comprising:
a plurality of storage cells for storing data;
a plurality of redundant spare storage cells for replacing defective storage cells; and
a memory access logic for accessing said plurality of storage cells connected to at least one replacement setting register, said at least one replacement setting register being writeable during operation of said memory circuit to store a plurality of replacement settings, wherein each of said plurality of replacement settings comprises:
first information data about a location of a storage cell cluster having at least one defective storage cell; and
second information data about a location of a spare storage cell cluster replacing said storage cluster, the second information data being different than the first information data.

2. The memory circuit according to claim 1, wherein said plurality of replacement settings stored in said at least one replacement setting register indicate which storage cells are replaced by spare storage cells.

3. The memory circuit according to claim 1, wherein said storage cell cluster is formed by a row of storage cells within a memory array of said memory circuit which are addressable by the same word line.

4. The memory circuit according to claim 1, wherein said storage cell cluster is formed by a column of storage cells within a memory array of said memory circuit which are addressable by the same bit line.

5. The memory circuit according to claim 1, wherein said at least one replacement setting register consists of flip-flop-circuits or latches for storing said plurality of replacement settings.

6. The memory circuit according to claim 5, wherein said at least one replacement setting register is writeable to store said plurality of replacement settings using a supply voltage of a normal operation mode of said memory circuit.

7. The memory circuit according to claim 5, wherein said at least one replacement setting register is writeable within a short time period of less than 10 nsec.

8. The memory circuit according to claim 1, wherein said memory circuit comprises at least one input/output circuit for connecting said memory circuit to a memory controller.

9. The memory circuit according to claim 8, wherein said memory controller is connected to a processor.

10. The memory circuit according to claim 9, wherein a non-volatile storage is connected to said memory controller or to said processor.

11. The memory circuit according to claim 1, wherein an error detection and correction unit is provided to determine defective storage cells of said memory circuit.

12. The memory circuit according to claim 11, wherein if said error detection and correction unit determines defective storage cells during an operation of said memory circuit, data stored in said defective storage cell is saved to a temporary data storage.

13. The memory circuit according to claim 11, wherein said error detection and correction unit is provided in said memory controller.

14. The memory circuit according to claim 11, wherein said error detection and correction unit is provided between said memory access logic and an input/output circuit for connecting said memory circuit to a memory controller.

15. The memory circuit according to claim 1, further comprising a memory controller operable to determine updated replacement settings depending on the location of defective storage cells detected during operation of the memory circuit and depending on the replacement settings already stored in the at least one replacement setting register.

16. A memory circuit comprising:
   a plurality of storage cells for storing data;
   a plurality of redundant spare storage cells for replacing defective storage cells; and
   at least one writeable replacement setting register for storing replacement settings, wherein each of said replacement settings comprises:
      first information data about a location of a storage cell cluster having at least one defective storage cell; and
      second information data about a location of a spare storage cell cluster replacing said storage cluster, the second information data being different than the first information data.

17. A method for in-operation memory repair of a memory circuit comprising the steps of:
   (a) performing a failure mapping to determine updated replacement settings depending on the location of defective storage cells detected during operation of said memory circuit and depending on replacement settings already stored in a replacement setting register of said memory circuit;
   (b) saving data stored in storage cells to be replaced according to the updated replacement settings by redundant spare storage cells into a temporary data storage;
   (c) writing the updated replacement settings in said replacement setting register; and
   (d) writing the saved data from the temporary data storage to the redundant spare storage cells indicated by the updated replacement settings,
      wherein said replacement settings comprise:
         information data about a location of a storage cell cluster having at least one defective storage cell; and
         information data about a location of a spare storage cell cluster replacing said storage cluster.

18. The method according to claim 17, wherein the replacement settings are loaded in said replacement setting register from a non-volatile storage during a boot-up of said memory circuit.

19. The method according to claim 17, wherein the updated settings are written to a non-volatile storage.

20. A method for memory repair of a memory circuit during a boot-up of said memory circuit comprising the steps of:
   (a) performing a boot-up memory test and deriving a failure mapping on the basis of failure information provided by said boot-up memory test to determine updated replacement settings depending on the location of defective storage cells detected during a boot-up test of said memory circuit and depending on replacement settings loaded from a non-volatile storage, wherein said replacement settings comprise information data about a location of a storage cell cluster having at least one defective storage cell and information data about a location of a spare storage cell cluster replacing said storage cluster; and
   (b) writing the updated replacement settings to a replacement setting register of said memory circuit.

21. The method according to claim 20, wherein the updated replacement settings are copied from said replacement setting register to said non-volatile storage.

* * * * *